United States Patent [19]

Nakamura et al.

[11] Patent Number: 5,026,435
[45] Date of Patent: Jun. 25, 1991

[54] HIGH STRENGTH LEAD FRAME MATERIAL AND METHOD OF PRODUCING THE SAME

[75] Inventors: Shuichi Nakamura, Yasugi; Hakaru Sasaki, Matsue; Rikizo Watanabe, Yasugi, all of Japan

[73] Assignee: Hitachi Metals, Ltd., Tokyo, Japan

[21] Appl. No.: 542,714

[22] Filed: Jun. 25, 1990

[30] Foreign Application Priority Data

Jun. 26, 1989 [JP] Japan .................................. 1-163595
Aug. 21, 1989 [JP] Japan .................................. 1-214607
Mar. 8, 1990 [JP] Japan .................................. 2-57566

[51] Int. Cl.$^5$ .......................... C22C 38/08; C21D 8/00
[52] U.S. Cl. .................................. 148/12 A; 148/12.1; 148/336; 420/95
[58] Field of Search ............... 148/336, 2, 12 A, 12 R, 148/12 B, 12.1, 442; 420/95, 581

[56] References Cited

U.S. PATENT DOCUMENTS 4,203,782  5/1980  Yamada et al. ..................... 148/336

FOREIGN PATENT DOCUMENTS 55-128565 10/1980 Japan .
55-131155 10/1980 Japan .
57-82455   5/1982 Japan .
59-198741 11/1984 Japan ..................................... 420/95
61-6251    1/1986 Japan .
1-61042    3/1989 Japan .

*Primary Examiner*—Deborah Yee
*Attorney, Agent, or Firm*—Finnegan, Henderson, Farabow, Garrett & Dunner

[57] ABSTRACT

A high strength lead frame material consists, by weight, of 0.5 to 22% Co, 22 to 32.5% Ni, not more than 1.0% Mn and not more than 0.5% Si and the balance Fe and incidental impurities. The contents of Ni and Co are selected so that the Ni content is 27 to 32.5% when the Co content is less than 12%, and so that, when the Co content is not less than 12%, the Ni content and the Co content meet the condition of $66\% \leq 2Ni + Co \leq 74\%$. The material has a two-phase structure formed of austenitic phase and martensitic phase, the austenitic phase occupying not less than 50% of the structure.

5 Claims, 1 Drawing Sheet

HIGH STRENGTH LEAD FRAME MATERIAL AND METHOD OF PRODUCING THE SAME

BACKGROUND OF THE INVENTION

1. Field of the Invention

The present invention relates to a material of lead frames of semiconductor devices, having strength greater than those of known materials. The invention also is concerned with a method of producing this material.

2. Description of the Related Art

In recent years, semiconductor devices such as logics and etc. are required to have greater capacities, higher degree of integration and thinner wall thickness regarding a package. Under this circumstance, there is a trend for a greater number of pins to be installed on lead frames of such semiconductor devices and for smaller wall thickness of the lead frames. This has given a rise to the demand for a lead frame material having a greater strength.

Hitherto, materials such as Fe-42i and Fe-29Ni-17Co (kovar) are known as materials for multi-pin Ferrous-type lead frame. Various proposals have been made for improving properties of these known materials. For instance, Japanese Unexamined Patent Publication No. 55-131155 discloses a high-strength Fe-Ni type alloy containing various strengthening elements. Improved alloys of Fe-Ni-Co type are disclosed in Japanese Unexamined Patent Publication Nos. 55-128565, 57-82455 and 61-6251, Japanese Examined Patent Publication Nos. 1-817 and 1-15562, and Japanese Unexamined Patent Publication No. 1-61042 of the same applicant as the present invention.

In most cases, a multi-pin lead frame is produced by photo-etching which is suitable for fine and delicate processing. Thin-walled multi-pin lead frames of Fe-42Ni or Fe-29Ni-17Co, produced through a delicate processing, tends to suffer from various problems. For instance, they are often apt to exhibit deformation such as camber, warp and so on during assembling of package, transportation and mounting, due to insufficient strength of the lead, as well as buckling due to application of impact during the use.

As mentioned before, various attempts and proposals have been made for improving Fe-Ni type alloys and Fe-Ni-Co type alloys. Namely, Japanese Unexamined Patent Publication No. 55-131155 proposes to improve strengths in Fe-Ni type alloys and Fe-Ni-Co type alloys by addition of Si, Mn and Cr. There are also various proposals for strengthening these alloys by addition of strengthening elements other than those mentioned above. It has also been proposed to control thermal expansion of Fe-Ni-Co type alloys as in, for example, Japanese Unexamined Patent Nos. 55-128565, 57-82455 and 61-6251, Japanese Examined Patent Publication Nos. 1-817 and 1-15562 and Japanese Unexamined Patent Publication No. 1-61042. The alloys strengthened by addition of strengthening elements, however, exhibit a large tendency of oxidation of the surface of the lead frame, due to excessive amounts of strengthening elements besides the major elements, resulting in serious degradation in solderability and platability both of which are very critical factors for lead frames. Among the above-mentioned Patent Publications proposing control of thermal expansion of Fe-Ni-Co type alloys, only Japanese Unexamined Patent No. 55-128565 attempts to positively improve the strength of the lead frame. The art disclosed in this patent publication, however, employs a strengthening mechanism which is distinct from that of the material of the present invention.

SUMMARY OF THE INVENTION

The present inventors have been interested in Fe-Ni-Co alloys which have unstable austenitic phase at normal temperatures, and have conducted experimental production of this type of alloy with various compositions and conditions. As a result, the present inventors have found that a lead frame with enhanced strength can be obtained without impairing properties of the lead frame, particularly solderability and platability, by using a material having a two-phase structure with a predetermined ratio of two phases which are formed by a deformation-induced martensitic transformation effected at a specific work ratio and by a precipitation of inverse-transformation austenitic phase (i.e., austenitic phase occurring by the heating thereof which austenitic phase is brought about by the transformation of the deformation-induced martensitic phase having been transformed from an initial austenitic phase) occurring by a subsequent annealing.

According to one aspect of the present invention, there is provided a high strength lead frame material consisting, by weight, of 0.5 to 22% Co, 22 to 32.5% Ni, not more than 1.0% Mn and not more than 0.5% Si and the balance Fe and incidental impurities, the contents of Ni and Co being determined such that the Ni content is 27 to 32.5% when the Co content is less than 12%, whereas, when the Co content is not less than 12%, the total of both the Ni content and the Co content is $66\% \leq 2Ni + Co \leq 74\%$, the material also having a two-phase structure formed of inverse-transformation austenitic phase (with or without residual austenitic phase) and martensitic phase, the austenitic phase occupying not less than 50% of the structure. Ni of 0.5 to 3% may be replaced by the same content of Cu.

According to another aspect of the invention, there is provided a method of producing a lead frame material comprising: preparing an alloy having the above-mentioned composition; subjecting the alloy to a solid-solution treatment conducted at a temperature not lower than austenitizing completion temperature; subjecting the alloy to cold working at a ratio of 40 to 90% so as to transform a part of the austenitic phase into work-induced martensitic phase; and subjection the alloy to an annealing conducted at a temperature not higher than the austenitizing completion temperature so as to bring about precipitation of inverse-transformation austenitic phase.

Thus, the most critical feature of the lead frame material of the present invention resides in that the strength is enhanced by the two-phase structure having austenitic and martensitic phases, without requiring strengthening elements which impair solderability and platability, in contrast to prior art Fe-Ni-Co alloys which are strengthened by addition of strengthening elements to a single-phase structure of austenite or martensite.

According to the invention, the contents of the elements of the material are limited for the following reasons.

Co provides an effect to minimize thermal expansion coefficient when its content is in the vicinity of about 17 wt % or about 5 wt %. Thermal expansion coefficient becomes excessively large to impede thermal expansion compatibility with silicon chips, when the Co content is below 0.5 wt % or when it exceeds 22 wt %. For this reason, the Co content is selected to be 0.5 to 22 wt %.

The content of Ni is determined in relation to the Co content. The martensitic transformation start temperature becomes high and austenitic phase becomes unstable when Ni content is below 27 wt % in a case where the Co content is below 12 wt % or when the content of (2Ni+CO) is below 66 wt % in another case where the Co content is not less than 12 wt %. In such cases, the austenite becomes unstable and martensitic transformation is undesirably commenced in the course of cooling in the solid-solution treatment, resulting in insufficient austenite formation. On the other hand, when Ni content exceeds 32.5 wt % in case where Co content is below 12 wt % or when the content of (2Ni+Co) exceeds 74 wt % in another case where Co content is not less than 12 wt %, the austenitic phase becomes too stable to bring about deformation-induced martensitic transformation. For these reasons, the Ni content is determined in relation to the Co content such that, when Co content is below 12 wt %, the Ni content is 27 to 32.5 wt %, whereas, when the Co content is not less than 12 wt %, the Ni content meets the condition of 66 wt % $\geq$ 2Ni+Co $\geq$ 74 wt %. Namely, in order to obtain an optimum composition, it is critical to control the Ni and Co contents such that the martensitic transformation starts at a temperature which is 0 to 200° C.

Cu is an element which improves resistance against corrosion occurring in a gap between the packaging resin and the lead frame. Appreciable crevice corrosion resistance cannot be obtained when the Cu content is below 0.5 wt %. On the other hands, when the Cu content exceeds 3 wt %, a brittle intermetallic compound of Cu and Sn occurs in the interface between the lead frame and solder, causing a greater tendency of separation of the solder. Cu also serves as an austenite stabilizer. When Cu is added in excess of 3 wt %, the austenitic phase becomes too stable to bring about deformation-induced transformation. The Cu content, therefore, is selected to be 0.5 to 3 wt %.

Mn, which acts as a deoxidizer, undesirably increases thermal expansion coefficient and impairs solderability and platability when its content exceeds 1.0 wt %. For this reason, the Mn content is selected to be not more than 1.0.

Si is added as a deoxidizer and, hence, it is preferable that no Si remains in the material. Presence of Si up to 0.5 wt %, however, is allowable because such small Si content does not cause substantial increase in the thermal expansion coefficient and substantial degradation in the solderability and platability.

C is an impurity and seriously impairs the etchability when its content exceeds 0.05 wt %. The content of this element is therefore limited to be not more than 0.05 wt %. More preferably, the C content should be limited to be not greater than 0.015 wt %.

The final structure of the material is determined by residual austenitic phase in the solid-solution treatment, work-induced martensitic phase and inverse-transformation austenitic phase precipitated in the final annealing. The material exhibits a too large thermal expansion coefficient to thereby impair the thermal expansion compatibility with silicon chips when the residual and inverse-transformation austenitic phases in total are below 50%. When the ratio of austenite is 100%, the strength of the substrate is seriously reduced. Thus, the material of the invention has a two-phase structure formed of austenitic phase including residual austenite and inverse-transformation austenite and martensite, wherein the austenitic phase in total occupies at least 50% of the structure. The amount (%) of the austenitic phase is a value which is determined through an analysis of X-ray diffraction intensity explained below.

Referring now to the process of producing the material of the present invention, it is impossible to obtain a required amount of austenitic phase when the temperature of the solid-solution treatment before the cold work is not higher than the austenitizing completion temperature. Therefore, the solid-solution treatment should be conducted at a temperature not lower than the austenitizing completion temperature. More preferably, the solid-solution treatment temperature is selected to be not higher than 950° C., in order to make crystal grains fine in size in a subsequent step.

The cold work ratio is selected to be 40 to 90 (%), because a value of this ratio below 40% cannot produce sufficient deformation-induced martensitic transformation, whereas a value exceeding 90 wt % causes a too intensive anisotropy of the material.

When the temperature of the final annealing exceeds the austenitizing completion temperature, whole work-induced martensitic phase is undesirably inverse-transformed to austenitic phase so that it becomes impossible to obtain a desired precipitation strengthening effect offered by the two-phase structure. The final annealing temperature, therefore, is selected to be below the austenitizing completion temperature.

Studies were made to find ranges of average thermal expansion coefficient between room temperature and 300° C. (represented by aR.T-300), hardness and tensile strength which are optimum for the assembling of package and the environment of use. As a result, it has been confirmed that a lead frame which can be used practically well is obtained when the following conditions are met: $3 \times 10^{-6}/°C. \leq aR.T-300 \leq 9 \times 10^{-6}/°C.$, hardness (Hv) $\geq$ 260 and tensile strength $\geq$ 80 kgf/mm$^2$.

Figure 1:
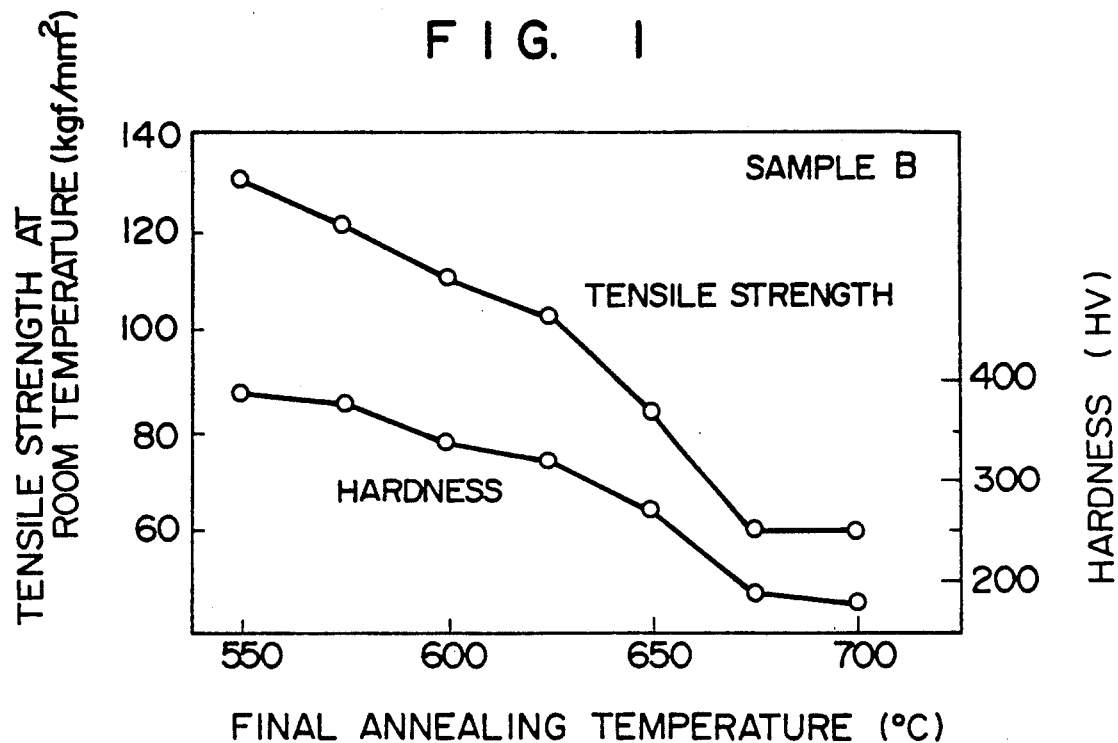
FIG. 1 is a graph showing the relationship between final annealing temperature and mechanical properties of a lead frame material according to the invention.

DESCRIPTION OF THE PREFERRED
EMBODIMENTS

Examples of the material according to the present invention will be described.

Alloys shown in Table 1 were melted, cast, forged at a temperature of 1100 to 1150° C., and hotrolled to a thickness of 3 mm. The rolled alloys were then subjected to a solid-solution treatment which has the steps of 1-hour heating at 1000° C. and a subsequent water cooling, and then to a cold rolling down to a thickness of 0.35 mm.

These test samples of 0.35 mm thick were then subjected to a series of treatments including a solidsolution treatment at 750° C., cold rolling down to 0.1 mm (71% in reduction ratio) and final annealing at 650° C. Properties of the test samples after this series of process are shown in Table 2. A sample K' appearing in Table 2 is a sample which was obtained by finishing the test sample K of 0.35 mm thick to the final thickness of 0.1 mm through a standard production process.

The amount or ratio (%) of the austenitic phase was determined from the following formula.

Ratio of austenitic phase (%)

$$\{I\gamma/(I\gamma+I\alpha)\} \times 100$$

$$I\gamma = I\gamma(111) + I\gamma(200) + I\gamma(220) + I\gamma(311) + I\gamma(222)$$

where $I\gamma(111)$ etc. show X-ray diffraction intensities of austenite $$I\alpha = I\alpha(110) + I\alpha(200) + I\alpha(211)$$

where $I\alpha(110)$ etc. show X-ray diffraction intensities of martensite.

samples were heated 5 minutes at 450° C. in atmospheric air. State of swell of plating layers was observed and evaluated.

** Solderability:

A solder weather resistance test (1000 Hr preservation at 150° C. in atmospheric air followed by 90° bending) was conducted and state of separation at lead/solder interface was observed and evaluated.

*** Crevice-corrosion resistance:

After dipping in 1%NaCl solution of 65° C., number of spots of corrosion at resin/lead frame interface was counted.

From Table 2, it is understood that the materials A to I according to the invention, which have two-phase

TABLE 1

| Sample No. | Chemical Compositions (wt %) | | | | | | | Fe | Remarks |
|---|---|---|---|---|---|---|---|---|---|
| | C | Si | Mn | Ni | Co | Cu | 2Ni + Co | | |
| A | 0.009 | 0.12 | 0.51 | 26.99 | 18.87 | | 72.85 | Bal | Material of the invention |
| B | 0.006 | 0.16 | 0.48 | 27.90 | 16.52 | | 72.32 | " | Material of the invention |
| C | 0.008 | 0.11 | 0.49 | 28.91 | 11.01 | | 68.32 | " | Material of the invention |
| D | 0.006 | 0.11 | 0.51 | 29.30 | 6.46 | | — | " | Material of the invention |
| E | 0.009 | 0.13 | 0.51 | 28.49 | 2.31 | | — | " | Material of the invention |
| F | 0.004 | 0.13 | 0.51 | 28.19 | 16.48 | 0.96 | 72.86 | " | Material of the invention |
| G | 0.005 | 0.11 | 0.49 | 28.35 | 6.03 | 2.51 | — | " | Material of the invention |
| H | 0.007 | 0.12 | 0.51 | 27.50 | 2.43 | 1.06 | — | " | Material of the invention |
| I | 0.007 | 0.12 | 0.51 | 31.05 | 4.50 | | — | " | Material of the invention |
| J | 0.009 | 0.12 | 0.50 | 26.05 | 9.04 | | — | " | Comparison material |
| K | 0.008 | 0.11 | 0.52 | 28.88 | 16.89 | | 74.65 | " | Conventional alloy |

TABLE 2

| Sample No. | Amount of austenite (%) | Hardness (Hv) | Tensile strength (kg/mm$^2$) | αR.T-300 (× 10$^{-6}$/°C.) | *Platability | **Solderability | ***Crevice corrosion resistance (piece/cm) | Remarks |
|---|---|---|---|---|---|---|---|---|
| A | 78 | 380 | 117 | 8.5 | No swell | No separation | 8 | Material of the invention |
| B | 92 | 270 | 85 | 5.2 | No swell | No separation | 9 | Material of the invention |
| C | 84 | 295 | 101 | 7.3 | No swell | No separation | 8 | Material of the invention |
| D | 90 | 302 | 103 | 6.8 | No swell | No separation | 8 | Material of the invention |
| E | 87 | 275 | 92 | 7.6 | No swell | No separation | 8 | Material of the invention |
| F | 91 | 273 | 87 | 5.4 | No swell | No separation | 2 | Material of the invention |
| G | 92 | 295 | 98 | 7.0 | No swell | No separation | 1 | Material of the invention |
| H | 89 | 270 | 85 | 7.7 | No swell | No separation | 2 | Material of the invention |
| I | 93 | 295 | 100 | 7.1 | No swell | No separation | 8 | Material of the invention |
| J | 20 | 322 | 104 | 10.7 | No swell | No separation | 8 | Comparison material |
| K | 100 | 217 | 61 | 4.5 | No swell | No separation | 9 | Conventional alloy |
| K' | 100 | 210 | 67 | 4.8 | No swell | No separation | 8 | Conventional alloy |

* Platability:

After a series of treatments including degreasing with solvent, electrolytic degreasing and pickling, a strike plating was effected to form Cu plating of 0.5 μm thick followed by Ag plating of 3 μm. Plated structure having both austenitic and martensitic phases, exhibit superior mechanical properties as compared with the known materials K and K' which have austenitic single-phase (austenite 100%) structures. A comparison material J exhibits superior mechanical properties but its thermal expansion coefficient undesirably exceeds $9 \times 10^{-6}/°$ C. due to too small amount or ratio of austenite. Alloys A to I of the present invention are superior also in solderability and platability. In particular, samples F, G and H containing Cu exhibit high resistance to crevice corrosion, besides the high strength.

Figure 2:
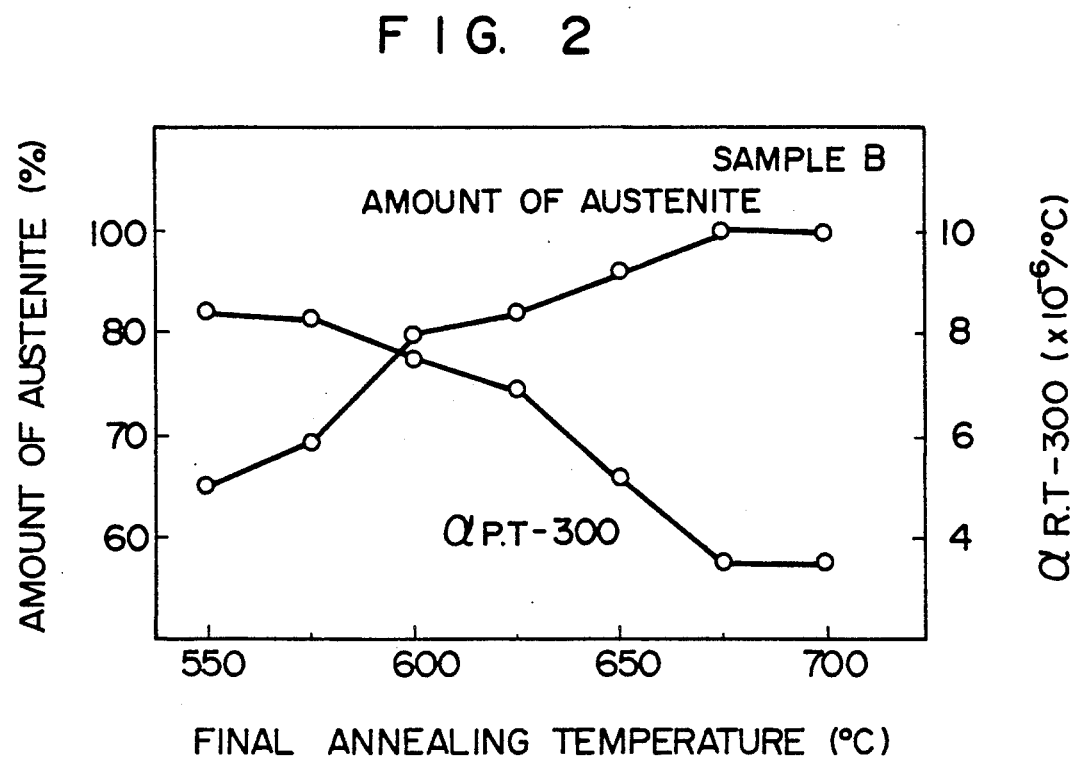
FIG. 2 is a graph showing the relationship between final annealing temperature, amount of austenite and average thermal expansion coefficient aR.T-300.

The relationship between mechanical properties and the final annealing temperature was examined in the test sample alloy B of the invention having the composition shown in Table 1, the results being shown in FIG. 1. FIG. 2 shows how the amount or ratio of austenitic phase varies according to the temperature of the final annealing as observed with the test sample alloy B. From FIG. 2, it is understood that the austenitizing completion temperature of this sample is not lower than 675°. When FIG. 1 is examined with this knowledge, it is understood that the test sample alloy B exhibits sufficiently high strength and hardness when the annealing temperature is below the austenitizing completion temperature but the strength and hardness are seriously impaired when the final annealing temperature exceeds the austenitizing completion temperature.

As will be seen from the foregoing description, the lead frame material of the invention has a specific composition of Fe-Ni-Co type alloy, and has a two-phase structure realized by a combination of a work-induced martensitic transformation in the final cold work and precipitation of inverse-transformation austenite caused in the final annealing. By the combination of these features, the present invention provides a material having mechanical properties required by current multi-pin type thin-walled lead frames, thus offering a great industrial advantage.

What is claimed is:

1. A high strength lead frame material consisting essentially of, by weight, of 0.5 to 22% Co, 22 to 32.5% Ni, wherein 0.5 to 3% of Ni may be replaced by the same amount of Cu, not more than 1.0% Mn and not more than 0.5% Si and the balance Fe and incidental impurities, the contents of Ni and Co being selected so that the Ni content is 27 to 32.5% when the Co content is less than 12%, and so that, when the Co content is not less than 12%, the Ni content and the Co content meet the condition of $66\% \leq 2\text{Ni} + \text{Co} \leq 74\%$, said material also having a two-phase structure formed of martensitic phase and inverse-transformation austenitic phase with or without residual austenitic phase, the austenitic phase occupying not less than 50% of said structure.

2. A high strength lead frame material according to claim 1, wherein 0.5 to 3% of Ni has been replaced by the same amount of Cu.

3. A high strength lead frame material according to one of claims 1 and 2, having an average thermal expansion coefficient of $3 \times 10^{-6}/°$ C. to $9 \times 10^{-6}/°$ C. in a temperature range between a room temperature and 300° C., a hardness not smaller than 260 in terms of Hv and a strength not smaller than 80 kgf/mm².

4. A method of producing a lead frame material, comprising the steps of: preparing an alloy having a composition consisting essentially of, by weight, of 0.5 to 22% Co, 22 to 32.5% Ni, wherein 0.5 to 3% of Ni may be replaced by the same amount of Cu, not more than 1.0% Mn and not more than 0.5% Si and the balance Fe and incidental impurities, the contents of Ni and Co being selected so that the Ni content is 27 to 32.5% when the Co content is less than 12%, and so that, when the Co content is not less than 12%, the Ni content and the Co content meet the condition of $66\% \leq 2\text{Ni} + \text{Co} \leq 74\%$, subjecting said alloy to a solid-solution treatment conducted at a temperature not lower than austenitizing completion temperature; subjecting said alloy to a cold working at a ratio of 40 to 90% to transform a part of the austenitic phase into work-induced martensitic phase; and subjecting said alloy to an annealing conducted at a temperature no higher than the austenitizing completion temperature to bring about precipitation of inverse-transformation austenitic phase.

5. A method of producing a lead frame material according to claim 4, wherein 0.5 to 3% of Ni has been replaced by the same amount of Cu.

* * * * *